(12) United States Patent
Chiou et al.

(10) Patent No.: US 11,573,143 B2
(45) Date of Patent: Feb. 7, 2023

(54) MEMS PRESSURE SENSING ELEMENT WITH STRESS ADJUSTORS TO MINIMIZE THERMAL HYSTERESIS INDUCED BY ELECTRICAL FIELD

(71) Applicant: Vitesco Technologies USA, LLC, Auburn Hills, MI (US)

(72) Inventors: Jen-Huang Albert Chiou, Libertyville, IL (US); Shiuh-Hui Steven Chen, Lake Zurich, IL (US)

(73) Assignee: VITESCO TECHNOLOGIES USA, LLC, Auburn Hills, MI (US)

( * ) Notice: Subject to any disclaimer, the term of this patent is extended or adjusted under 35 U.S.C. 154(b) by 106 days.

(21) Appl. No.: 17/236,068

(22) Filed: Apr. 21, 2021

(65) Prior Publication Data

US 2022/0341799 A1    Oct. 27, 2022

(51) Int. Cl.
  *G01L 9/00*  (2006.01)
  *B81B 7/02*  (2006.01)
  *G01L 19/14*  (2006.01)
(52) U.S. Cl.
  CPC .............. *G01L 9/0055* (2013.01); *B81B 7/02* (2013.01); *G01L 9/0042* (2013.01); *G01L 19/148* (2013.01); *B81B 2201/0264* (2013.01)
(58) Field of Classification Search
  None
  See application file for complete search history.

(56) References Cited

U.S. PATENT DOCUMENTS

| | | | |
|---|---|---|---|
| 6,952,042 B2 | 10/2005 | Stratton et al. | |
| 7,808,365 B2* | 10/2010 | Tojo | G01L 9/0054 338/42 |
| 8,631,707 B2* | 1/2014 | Kurtz | G01L 19/04 73/715 |
| 9,557,237 B2 | 1/2017 | McNeal | |
| 10,697,844 B2* | 6/2020 | Hess | G01L 19/148 |
| 2005/0172724 A1 | 1/2005 | Yamashita et al. | |

(Continued)

FOREIGN PATENT DOCUMENTS

| | | |
|---|---|---|
| CN | 103063339 A | 4/2013 |
| DE | 102007057877 A1 | 6/2009 |

OTHER PUBLICATIONS

Esashi, M. et al., Fabrication of Catheter-Tip and Sidewall Miniature Pressure Sensors, IEEE translations on Electron Devices, vol. ED-29, No. Jan. 1, 1982, pp. 57-63.

*Primary Examiner* — Peter J Macchiarolo
*Assistant Examiner* — Jermaine L Jenkins

(57) ABSTRACT

A pressure sensing element, including a substrate, a device layer coupled to the substrate, a diaphragm being part of the device layer, and a plurality of piezoresistors coupled to the diaphragm. A plurality of bond pads is disposed on the device layer, and an electrical field shield is bonded to the top of device layer and at least one of the bond pads. At least one stress adjustor is part of the electrical field shield, where the stress adjustor is a cut-out constructed and arranged to reduce thermal hysteresis of the pressure sensing element caused by stress relaxation of the electrical field shield during a cooling and heating cycle. The stress adjustor may be a thin film deposited on top of the electrical field shield, which may apply residual stress to the piezoresistors. The pressure sensing element may include a cavity integrally formed as part of the substrate.

30 Claims, 13 Drawing Sheets

(56) References Cited

U.S. PATENT DOCUMENTS

| | | |
|---|---|---|
| 2006/0278012 A1 | 12/2006 | Fujimoto |
| 2012/0241822 A1 | 3/2012 | Takenaka |
| 2013/0042694 A1 | 2/2013 | Ned |
| 2013/0062713 A1 | 3/2013 | Sakuragi et al. |
| 2014/0159122 A1 | 6/2014 | Sato |
| 2015/0260596 A1 | 9/2015 | Lemke et al. |
| 2019/0368956 A1 | 12/2019 | Chiou et al. |

\* cited by examiner

FIG. 7C
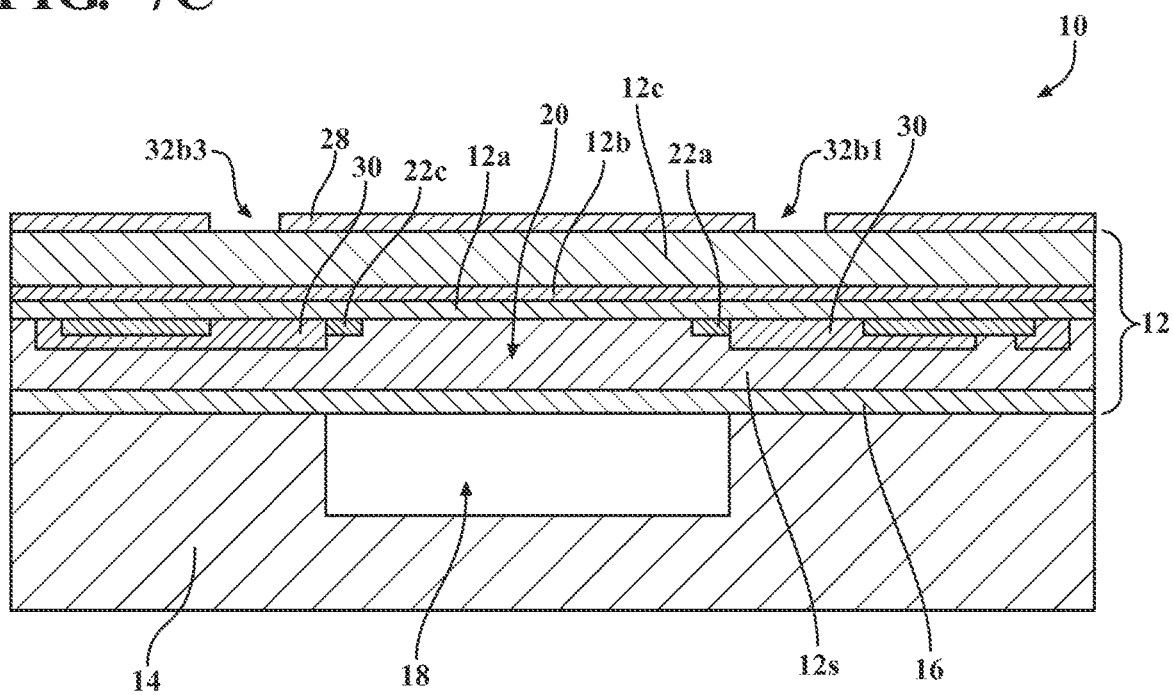
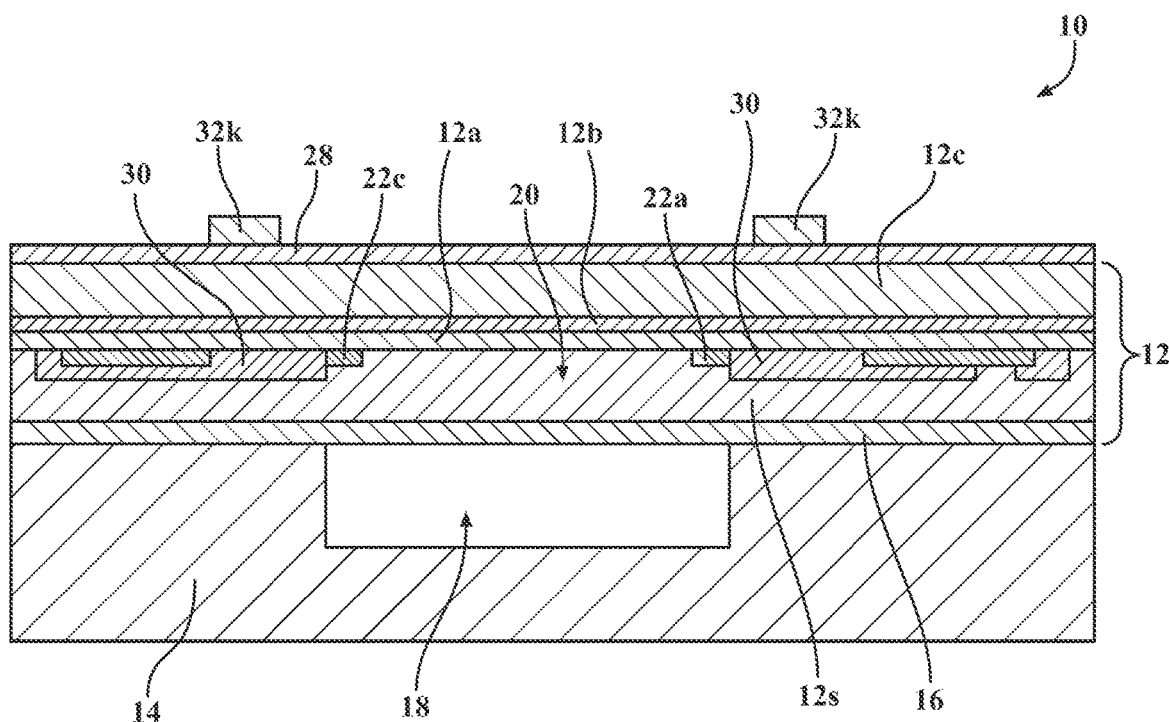
FIG. 8

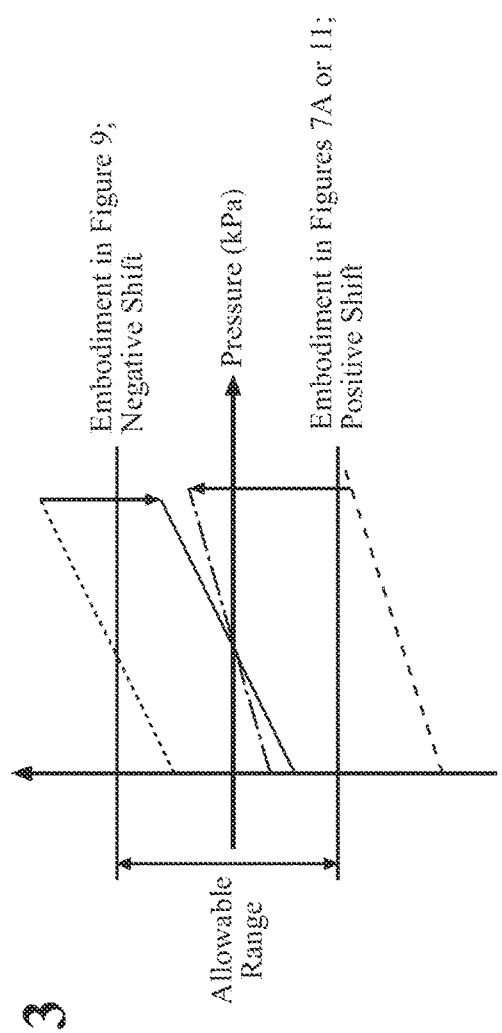
FIG. 13
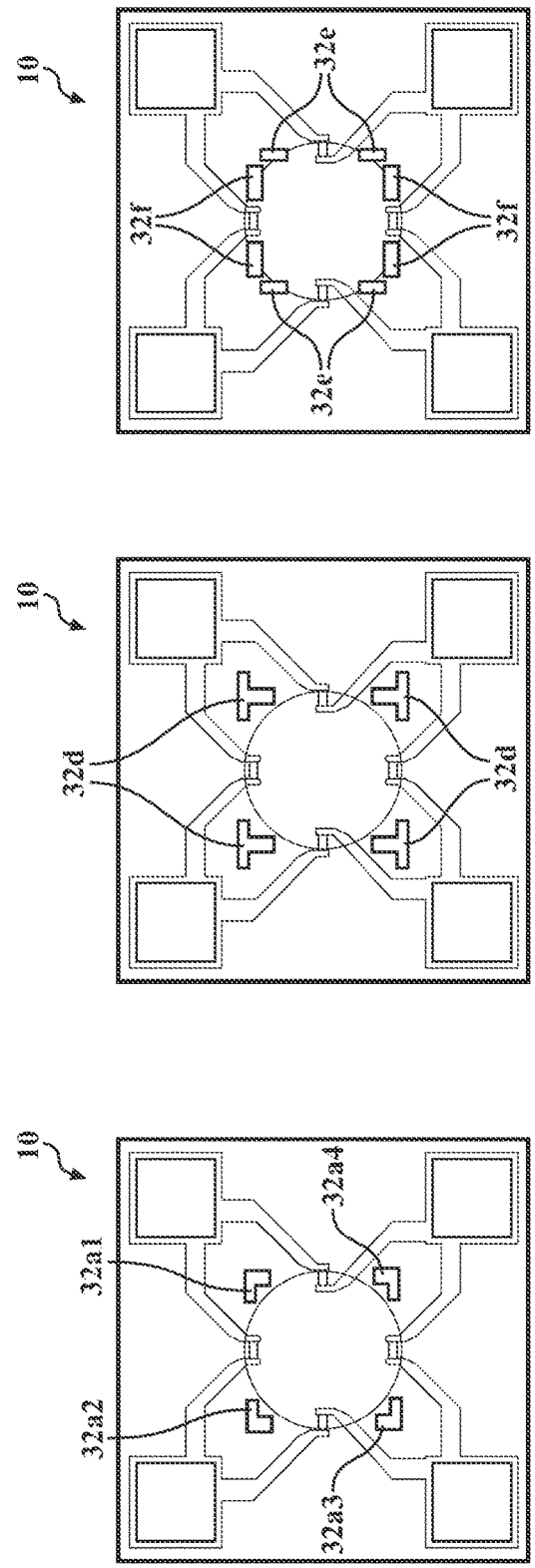
FIG. 14A
FIG. 14B
FIG. 14C

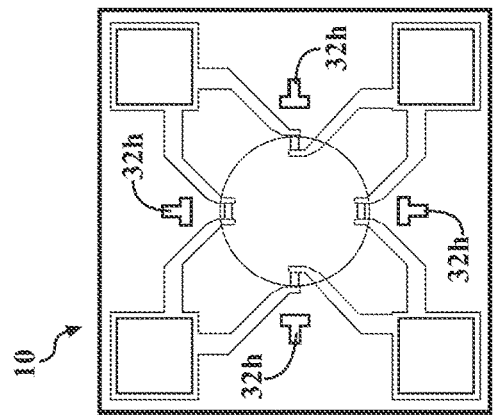
FIG. 15A
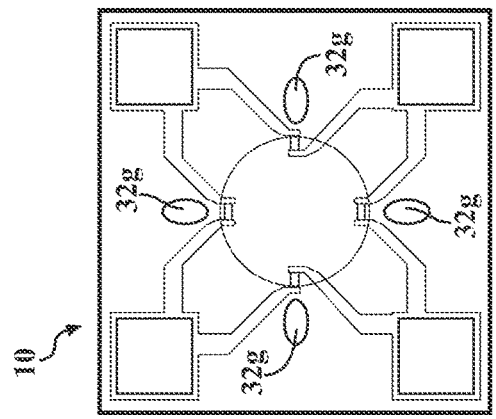
FIG. 15B
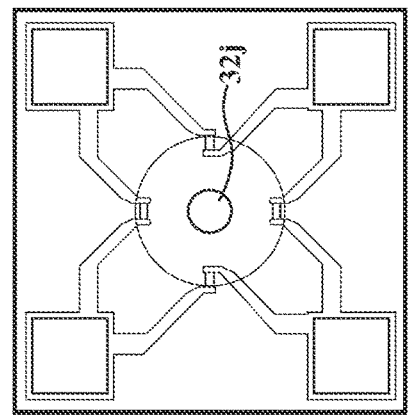
FIG. 15C
FIG. 16A
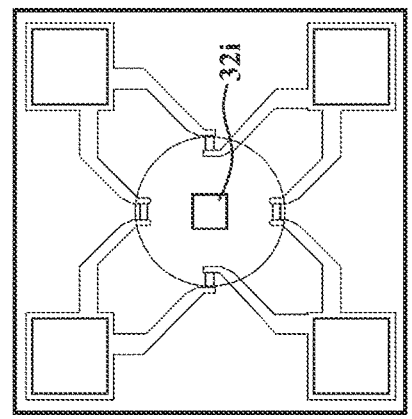
FIG. 16B
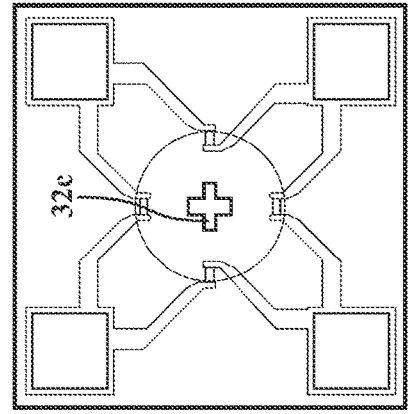
FIG. 16C

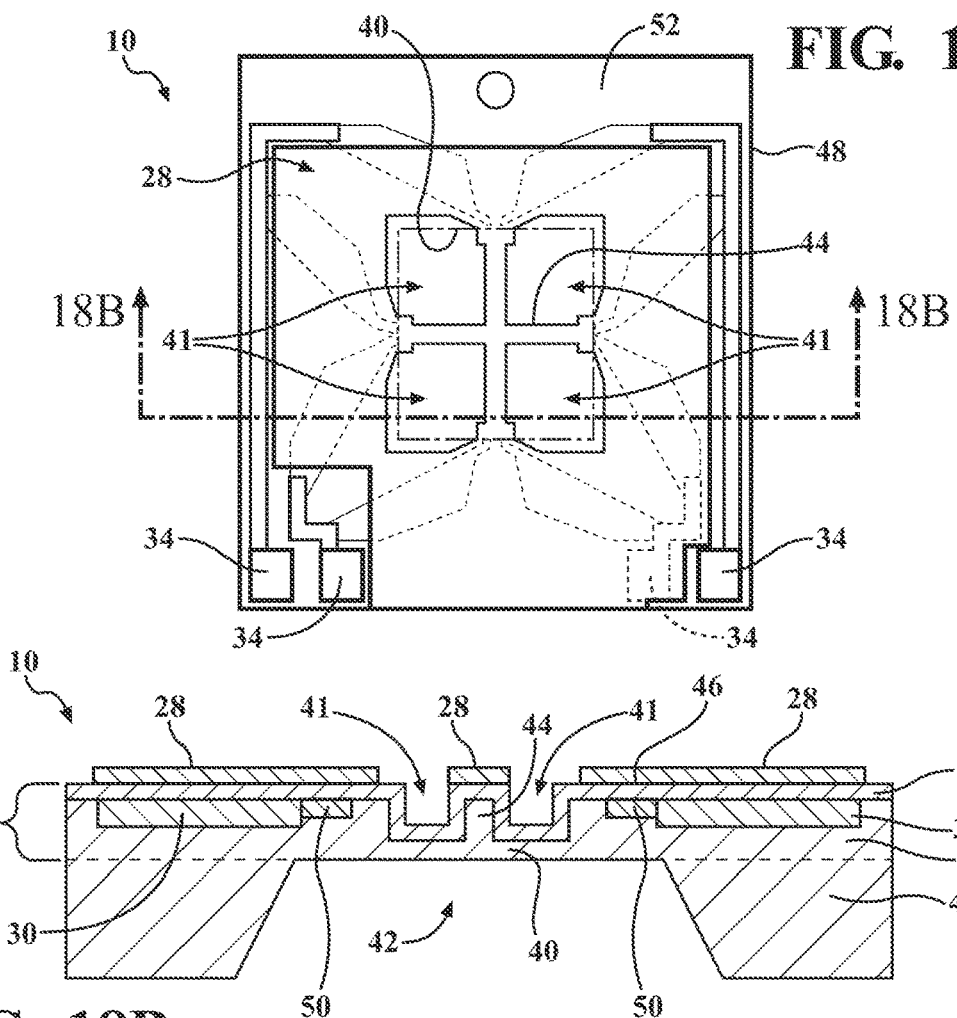
FIG. 18A
FIG. 18B
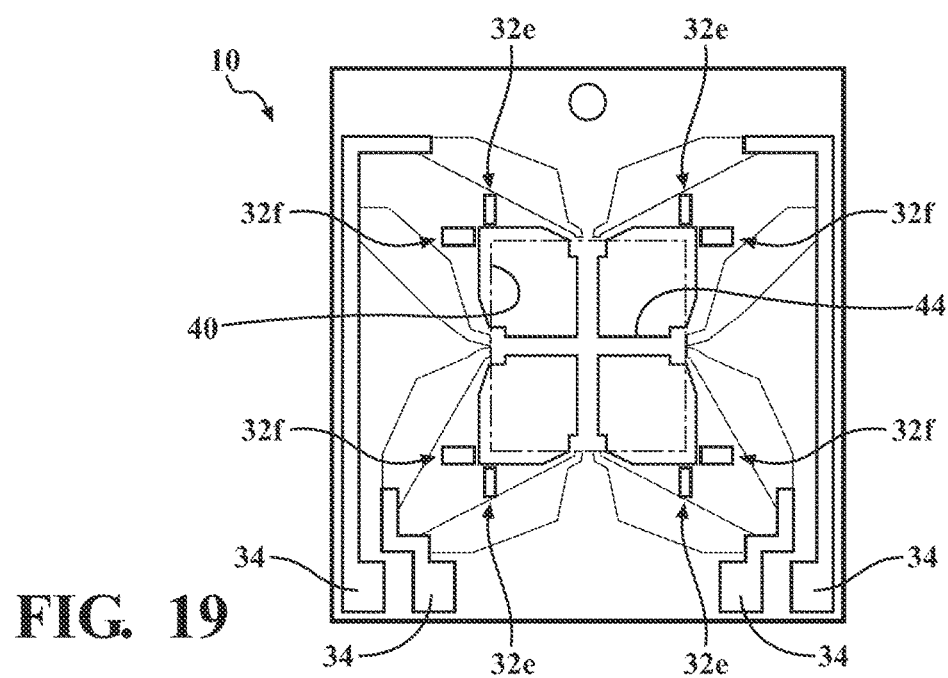
FIG. 19

MEMS PRESSURE SENSING ELEMENT WITH STRESS ADJUSTORS TO MINIMIZE THERMAL HYSTERESIS INDUCED BY ELECTRICAL FIELD

CROSS-REFERENCE TO RELATED APPLICATIONS

This application claims the benefit of provisional application 63/198,879 filed Nov. 19, 2020. The disclosure of the above application is incorporated herein by reference.

FIELD OF THE INVENTION

The invention relates generally to a pressure sensing element which includes at least one stress adjustor to minimize the thermal-mechanical effect of stress relaxation of an electrical field shield, and thus minimize thermal hysteresis.

BACKGROUND OF THE INVENTION

Microelectromechanical system (MEMS) pressure sensing elements are generally known and widely used. Cavity silicon-on-insulator (C-SOI) wafers are a cutting edge SOI technology where the handle wafer (or supporting wafer) contains pre-etched cavities. One type of cavity silicon-on-insulator (CSOI) MEMS pressure sensing element is an absolute pressure sensing element which includes a silicon device layer fusion-bonded onto a silicon supporting substrate containing a pre-etched cavity to form a reference vacuum in the cavity. The pressure sensing element includes four piezoresistors connected into what is known as a "Wheatstone Bridge" configuration. The piezoresistors are doped on a diaphragm disposed over the cavity so as to detect deflection of the diaphragm due to pressure changes. The pressure sensing element may include an electrical field shield for reducing or eliminating the influence of electrical charge on the pressure sensing element during operation.

These MEMS pressure sensing elements are manufactured in different sizes and used for various applications. However, the use of an electrical field shield results in thermal hysteresis, which cannot be calibrated.

With reference to the hysteresis loop shown in FIG. 1, during the thermal cooling and heating process of a MEMS pressure sensing element, the voltage output is not maintained. The output voltage is measured at an initial point ($V_I$) at room temperature around 22° C. The temperature of the MEMS pressure sensing element is then decreased to -40° C., and then increased back to 22° C. and the voltage output at this mid-point ($V_M$) is measured and is higher than the output voltage at the initial point ($V_I$). The temperature of the MEMS pressure sensing element is then increased to 150° C. and then decreased back to the room temperature and the output voltage of the MEMS pressure sensing element is measured at this final point ($V_F$). The cold hysteresis voltage=$V_M$-$V_I$. The hot hysteresis voltage=$V_F$-$V_I$. The worst voltage difference=$V_F$-$V_M$ is considered herewith as the thermal hysteresis voltage. The thermal hysteresis is defined as the thermal hysteresis voltage divided by the span. There are instances where the thermal hysteresis is too high, and the MEMS pressure sensing element may not be calibrated.

The root cause of thermal hysteresis of the MEMS pressure sensing element is due to the electrical field shield stress relaxation (viscoplasticity) in the cooling and heating process of the electrical field shield deposited on the MEMS pressure sensing element. The biaxial stress is unable to return to the original residual stress state in a short time. The thermal residual stress difference causes the output voltage shift, referred to as the "thermal hysteresis voltage."

A compressive residual stress on the electrical field shield causes a tensile stress on the piezoresistor while a tensile residual stress on the electrical field shield causes a compressive stress on the piezoresistor. It is noted that a different electrical field shield material may cause the cycling stress loop shown in FIG. 2 to be reversed, and the output voltage at the final point higher than the output voltage at the middle point, which is a reverse loop of FIG. 1.

FIG. 3 shows a top view of a MEMS pressure sensing element having an electrical field shield FS to reduce or eliminate the influence of electrical charge on the pressure sensing element during operation. A diagonal cross-sectional view of the MEMS pressure sensing element is depicted in FIG. 4 with more-detailed layers. FIG. 5 shows a top view of stress components on piezoresistors. In a Wheatstone bridge circuit, R1 and R3 are one pair while R2 and R4 are the other pair.

With the intrinsic and thermally mismatched residual stress at the middle point and the final point during the thermal loop induced by the electrical field shield, the radial stress is higher than the tangential stress sensed on each piezoresistor if the electrical field shield causes a tensile stress on the piezoresistors. Please note that a differential electrical field shield material may cause a compressive stress on the piezoresistors. The stress relaxation of the electrical field shield during a cooling and heating cycle causes stress differences higher and thus causes a higher thermal hysteresis voltage between the middle point and the final point. The higher thermal hysteresis voltage results in a higher thermal hysteresis.

For pressure sensing, each piezoresistor senses much higher radial stress than tangential stress subjected to the pressure applied, also depicted in FIG. 6.

However, coupled with the intrinsic and thermally mismatched residual stress at the middle point and the final point during the thermal loop induced by the electrical field shield, the radial stress is even higher than the tangential stress on each piezoresistor. The higher stress differences between the middle point and the final point cause a higher thermal hysteresis voltage and thermal hysteresis. Thus, the thermal hysteresis at a higher pressure is higher than the thermal hysteresis at a lower pressure.

Accordingly, there exists a need for a reduction or elimination of thermal hysteresis in a MEMS pressure sensing element having an electrical field shield.

SUMMARY OF THE INVENTION

In an embodiment, the present invention is a MEMS pressure sensing element having an electrical field shield, where the electrical field shield has at least one stress adjustor. The stress adjustor tunes the magnitude of the longitudinal stresses and the transverse stresses on the piezoresistors to change the thermal hysteresis voltage between the middle point and the final point and shift the thermal hysteresis up or down to minimize thermal hysteresis.

In an embodiment, the present invention is a pressure sensing element, including a supporting substrate, a cavity integrally formed as part of the supporting substrate, a device layer bonded to the supporting substrate, a diaphragm being part of the device layer, the diaphragm covering the cavity in a sealed manner, and a plurality of piezoresistors coupled to the diaphragm. A plurality of bond pads is disposed on the device layer, and an electrical field shield is bonded to an outer surface the device layer such that the electrical field shield is on top of the device layer and at least one of the bond pads. At least one stress adjustor is part of the electrical field shield, where the stress adjustor is constructed and arranged to reduce thermal hysteresis of the pressure sensing element caused by stress relaxation of the electrical field shield during a cooling and heating cycle of the pressure sensing element.

In an embodiment, the pressure sensing element includes a plurality of stress adjustors.

In an embodiment, the stress adjustor is integrally formed as part of the electrical field shield so as to decrease radial stresses on the plurality of piezoresistors and increase tangential stresses on the plurality of piezoresistors during the cooling and heating cycle.

In an embodiment, the stress adjustor is integrally formed as part of the electrical field shield so as to increase radial stresses on the plurality of piezoresistors and decrease tangential stresses on the plurality of piezoresistors during the cooling and heating cycle.

In an embodiment, the stress adjustor is a cut-out, where a portion of the electrical field shield has been removed. The cut-out may have one of several shapes, including, but not limited to, L-shaped, square, circular, rectangular, cross-shaped, or T-shaped. Additionally, several stress adjustors may be used to achieve the desired thermal hysteresis.

In an embodiment, the pressure sensing element includes a plurality of stress adjustors in the form of a plurality of cut-outs, and each of the plurality of cut-outs are rectangular shaped, and at least two of the plurality of cut-outs are arranged in an L-shaped configuration.

In an embodiment, the stress adjustor is a thin film, where the thin film deposited on top of the electrical field shield. In an embodiment, the thin film applies residual stress to the plurality of piezoresistors.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 7C is a sectional view taken along lines 7C-7C in FIG. 7A;

FIG. 8 is a sectional view of an alternate embodiment of the pressure sensing element shown in FIGS. 7A-7C having an electrical field shield with stress adjustors according to embodiments of the present invention;

FIG. 13 is a chart of the shift in thermal hysteresis resulting from the location of the stress adjustors in the first three embodiments of the present invention;

FIG. 14A is another top view of a second embodiment of a MEMS pressure sensing element having an electrical field shield with stress adjustors, according to embodiments of the present invention;

FIG. 14B is a top view of a fourth embodiment of a MEMS pressure sensing element having an electrical field shield with stress adjustors, according to embodiments of the present invention;

FIG. 14C is a top view of a fifth embodiment of a MEMS pressure sensing element having an electrical field shield with stress adjustors, according to embodiments of the present invention;

FIG. 15A is another top view of a first embodiment of a MEMS pressure sensing element having an electrical field shield with stress adjustors, according to embodiments of the present invention;

FIG. 15B is a top view of a sixth embodiment of a MEMS pressure sensing element having an electrical field shield with stress adjustors, according to embodiments of the present invention;

FIG. 15C is a top view of a seventh embodiment of a MEMS pressure sensing element having an electrical field shield with stress adjustors, according to embodiments of the present invention;

FIG. 16A is another top view of a third embodiment of a MEMS pressure sensing element having an electrical field shield with stress adjustors, according to embodiments of the present invention;

FIG. 16B is a top view of an eighth embodiment of a MEMS pressure sensing element having an electrical field shield with stress adjustors, according to embodiments of the present invention;

FIG. 16C is a top view of a ninth embodiment of a MEMS pressure sensing element having an electrical field shield with stress adjustors, according to embodiments of the present invention;

FIG. 18A is a top view of a differential MEMS pressure sensing element having an electrical field shield, where the stress adjustors are not shown, according to embodiments of the present invention;

FIG. 18B is a sectional view of a differential MEMS pressure sensing element having an electrical field shield, according to embodiments of the present invention;

FIG. 19 is a top view of a first embodiment of a differential MEMS pressure sensing element having an electrical field shield with stress adjustors, according to embodiments of the present invention;

DETAILED DESCRIPTION OF THE PREFERRED EMBODIMENTS

The following description of the preferred embodiment(s) is merely exemplary in nature and is in no way intended to limit the invention, its application, or uses.

Figure 7A:
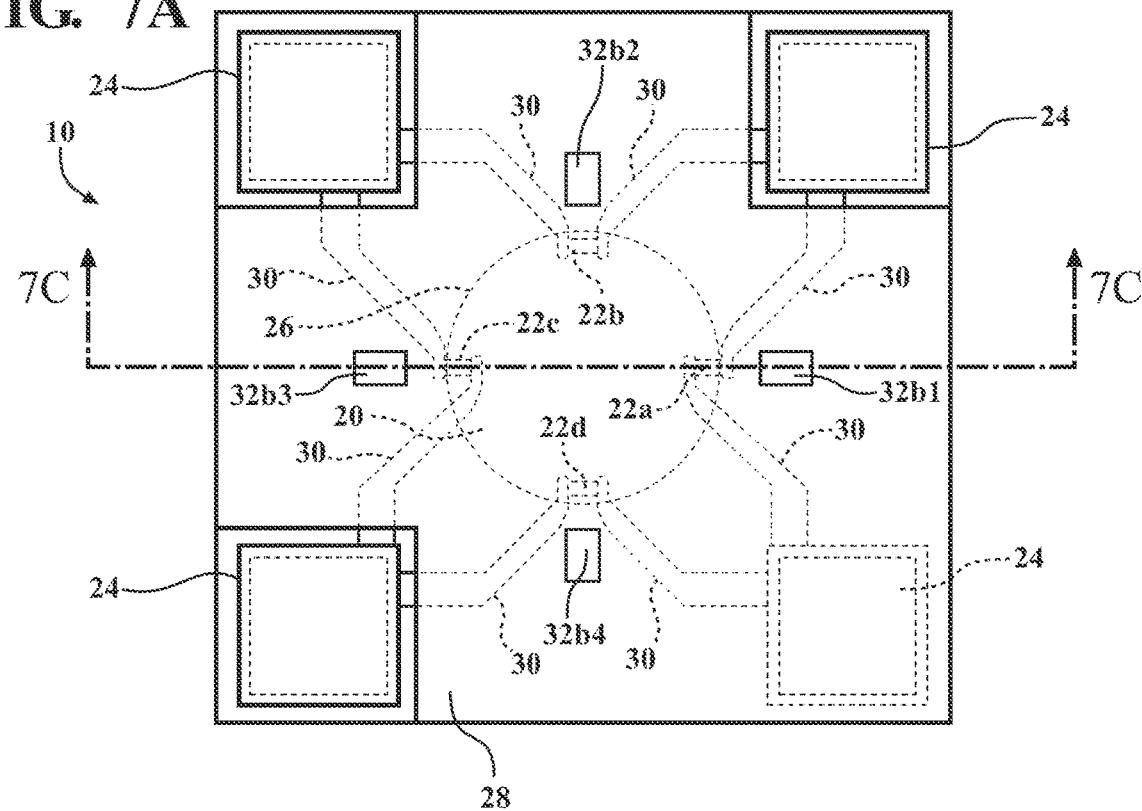
FIG. 7A is a top view of first embodiment of a MEMS pressure sensing element having an electrical field shield with stress adjustors, according to embodiments of the present invention.
Figure 7B:
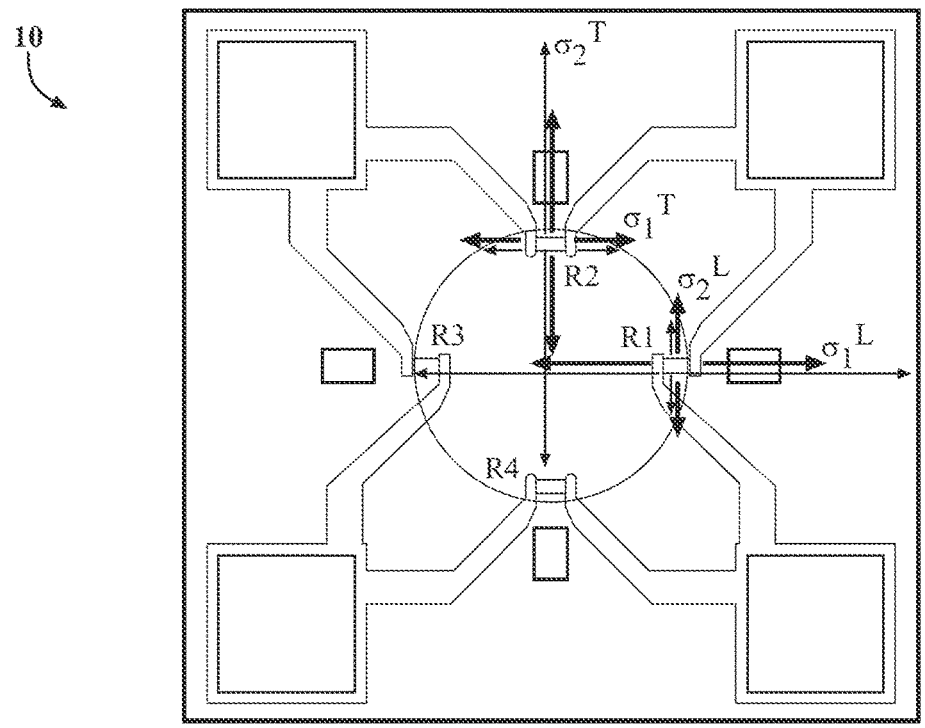
FIG. 7B is a top view of first embodiment of a MEMS pressure sensing element having an electrical field shield with stress adjustors, and showing radial and tangential stresses, according to embodiments of the present invention.

A MEMS pressure sensor includes a MEMS pressure sensing element and an ASIC encapsulated and protected by a housing. An example of the MEMS pressure sensing element according to a first embodiment of the present invention is shown in FIGS. 7A-7C, generally at 10. The MEMS pressure sensing element 10 includes a device layer, generally indicated at 12, and a supporting silicon substrate 14. The device layer 12 includes a silicon layer 12s, a plurality of electrical insulating layers 12a, 12b, 12c, and a buried oxide layer 16. A recess or cavity, shown generally at 18, is formed as part of the supporting substrate 14. The device layer 12 is attached to the supporting substrate 14 such that a diaphragm 20 of the device layer 12 covers the cavity 18 in a sealed manner to define a vacuum cavity under the diaphragm 20.

A plurality of piezoresistors 22a, 22b, 22c, 22d is doped and a plurality of bond pads 24 is deposited or otherwise coupled to the device layer 12. There is also a plurality of conductors 30 which are connected to and in electrical communication with the piezoresistors 22a, 22b, 22c, 22d and the bond pads 24 as shown in FIGS. 7A-7C. The bond pads 24 are metal and, in one embodiment are gold. The piezoresistors 22a, 22b, 22c, 22d are arranged in the standard distributed Wheatstone Bridge arrangement on the device layer 12 and near a circumferential edge 26 of the diaphragm 20 so as to sense stresses upon deflection of the diaphragm 20. In order to reduce or eliminate the influence of external charge, an electrical field shield 28 (shown in FIGS. 7A and 7C, but not shown in FIG. 7B), is sputtered on the top of the pressure sensing element 10, which is bonded to an outer surface and is on top of the device layer 12, and connected to one of the bond pads 24.

In FIGS. 7A and 7C, the MEMS pressure sensing element 10 includes an electrical field shield 28 on the outer surface, the electrical field shield 28 having stress adjustors 32b1, 32b2, 32b3, 32b4. In the embodiment shown in FIGS. 7A-7C, the stress adjustors 32b1, 32b2, 32b3, 32b4 are material removal areas, or areas where material from the field shield 28 has been removed (also referred to as "cutouts"). In FIGS. 7A and 7C, the field shield is shown along with several cut-outs as the stress adjustors 32b1, 32b2, 32b3, 32b4. FIG. 7C shows a cross-sectional view of FIG. 7A with cut-outs in the electrical field 28 as stress adjustors. In FIG. 7B, for clarity the field shield 28 is not shown, however, the location of the stress adjustors 32b1, 32b2, 32b3, 32b4 is still shown. In this embodiment, the stress adjustors 32b1, 32b2, 32b3, 32b4 are material removal areas in the form of rectangular-shaped cut-outs, located near corresponding piezoresistors 22a, 22b, 22c, 22d, which shift thermal hysteresis upward. As depicted in FIG. 7A-7C (with the directions of the stress shown in FIG. 7B), a near-piezoresistor cut-out adjacent to the first piezoresistor 22a as a stress adjustor 32b1 significantly increases radial stress on the first piezoresistor 22a, which is the longitudinal stress on the first piezoresistor 22a. The stress adjustor 32b1 adjacent to the first piezoresistor 22a also slightly decreases tangential stress, which is the transverse stress on the first piezoresistor 22a. An adjustor 32b2 adjacent to the second piezoresistor 22b significantly increases radial stress on the second piezoresistor 22b, but which is the transverse stress on the second piezoresistor 22b. The stress adjustor 32b2 adjacent to the second piezoresistor 22b also slightly decreases tangential stress, which is the longitudinal stress on the second piezoresistor 22b. The stress adjustor 32b3 adjacent to the third piezoresistor 22c causes stress changes on the third piezoresistor 22c similarly to the first piezoresistor 22a and the stress adjustor 32b4 adjacent to the fourth piezoresistor 22d causes stress changes on the fourth piezoresistor 22d similarly to the second piezoresistor 22b.

Referring again to FIG. 1, the stress component changes on the piezoresistors 22a, 22b, 22c, 22d cause the output voltages higher at the middle point M and the final point F during a cooling and heating cycle, which move the thermal hysteresis voltage more positively and thus shift the thermal hysteresis upward.

Referring to FIG. 8, a cross-sectional view of an alternate embodiment of the pressure sensing element 10 in FIGS. 7A-7C is shown, with like numbers referring to like elements. In this embodiment, there are no cut outs, and the field shield 28 therefore has no material removal areas. The field shield 28 shown in FIG. 8 has a thin film deposited on areas of the electrical field shield 28 which function as stress adjustors 32k. In the embodiment shown in FIG. 8, the stress adjustors 32k are located in the areas on the electrical field shield 28 as shown, but it is within the scope of the invention that the stress adjustors 32k may be located on other areas of the field shield 28.

Figure 9:
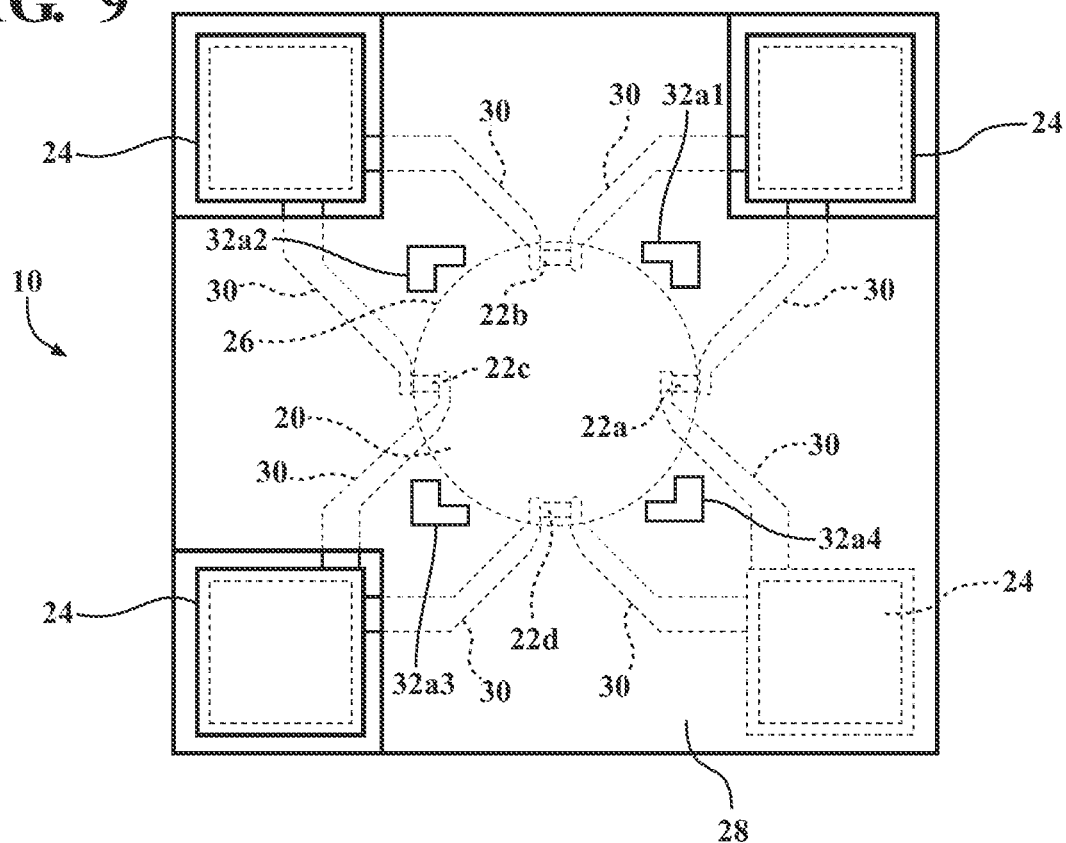
FIG. 9 is a top view of second embodiment of a MEMS pressure sensing element having an electrical field shield with stress adjustors, according to embodiments of the present invention.
Figure 10:
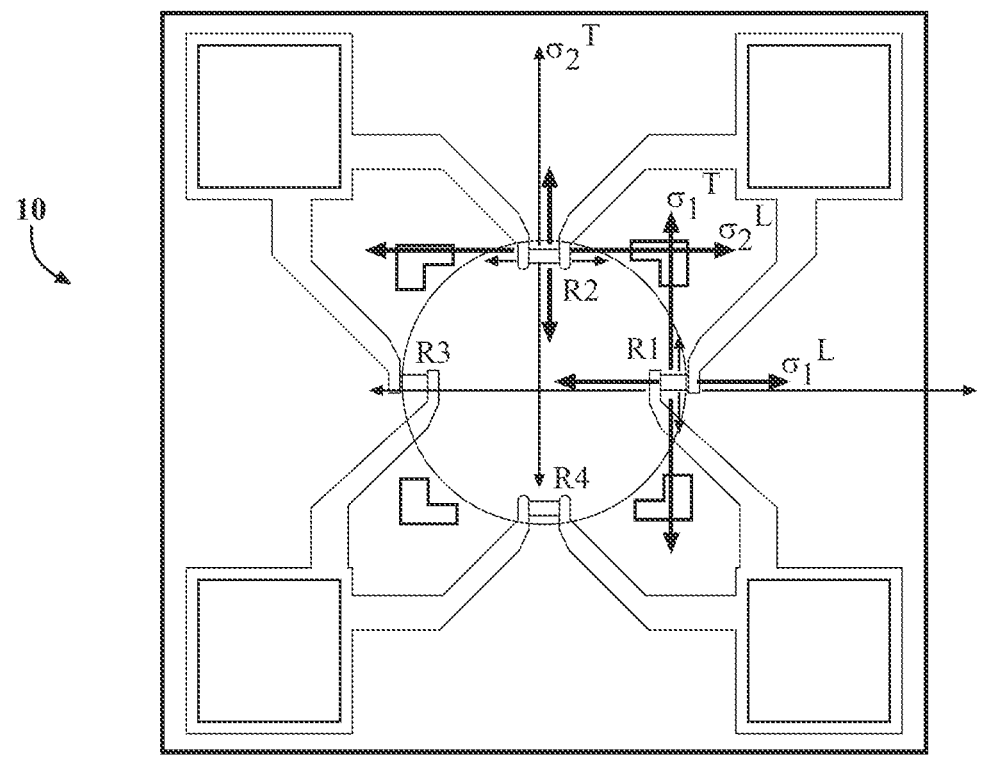
FIG. 10 is a top view of second embodiment of a MEMS pressure sensing element having an electrical field shield with stress adjustors, and showing radial and tangential stresses, according to embodiments of the present invention.

Another embodiment of the present invention is shown in FIGS. 9-10, with like numbers referring to like elements. The field shield 28 includes several stress adjustors 32a1, 32a2, 32a3, 32a4, which in the embodiment shown in FIGS. 9-10 are material removal areas, or areas where material from the field shield 28 has been removed. In FIG. 9, the field shield 28 is shown along with the stress adjustors 32a1, 32a2, 32a3, 32a4. In FIG. 10, for clarity the field shield 28 is not shown, however, the location of the stress adjustors 32a1, 32a2, 32a3, 32a4 is still shown. The stress adjustors 32a1, 32a2, 32a3, 32a4 shown in FIGS. 9-10 are corner cut-outs, and are "L-shaped," which shift thermal hysteresis downward.

As shown in FIGS. 9-10 (with the directions of the stresses shown in FIG. 10), two stress adjustors 32a1, 32a4 adjacent to the first piezoresistor 22a, significantly increase tangential stress on the first piezoresistor 22a, which is the transverse stress on the first piezoresistor 22a. The stress adjustors 32a1, 32a4 also slightly reduce radial stress which is the longitudinal stress on the first piezoresistor 22a. The sizes, locations and shapes of the two stress adjustors 32a1, 32a4 make the tangential stress higher than the radial stress and affect their magnitudes. Two stress adjustors 32a1, 32a2 adjacent to the second piezoresistor 22b significantly increases tangential stress on the second piezoresistor 22b, but which is the longitudinal stress on the second piezoresistor 22b. The stress adjustors 32a1, 32a2 also slightly reduce radial stress on the second piezoresistor 22b, but which is the transverse stress on the second piezoresistor 22b. Two stress adjustors 32a2, 32a3 adjacent to the third piezoresistor 22c cause stress changes on the third piezoresistor 22c similarly to the first piezoresistor 22a. Similar to the second piezoresistor 22b, two stress adjustors 32a3, 32a4 adjacent to the fourth piezoresistor 22d cause a higher tangential stress and lower radial stress on the fourth piezoresistor 22d.

Figure 1:
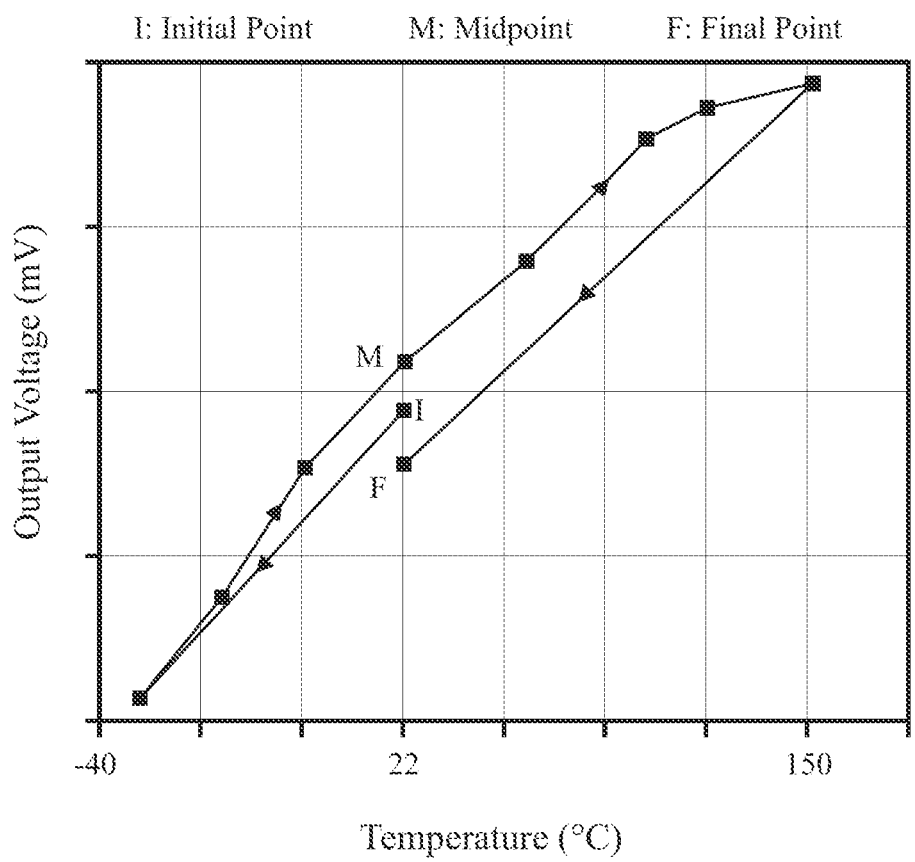
FIG. 1 is a chart of a thermal hysteresis loop of a MEMS pressure sensing element.
Figure 2:
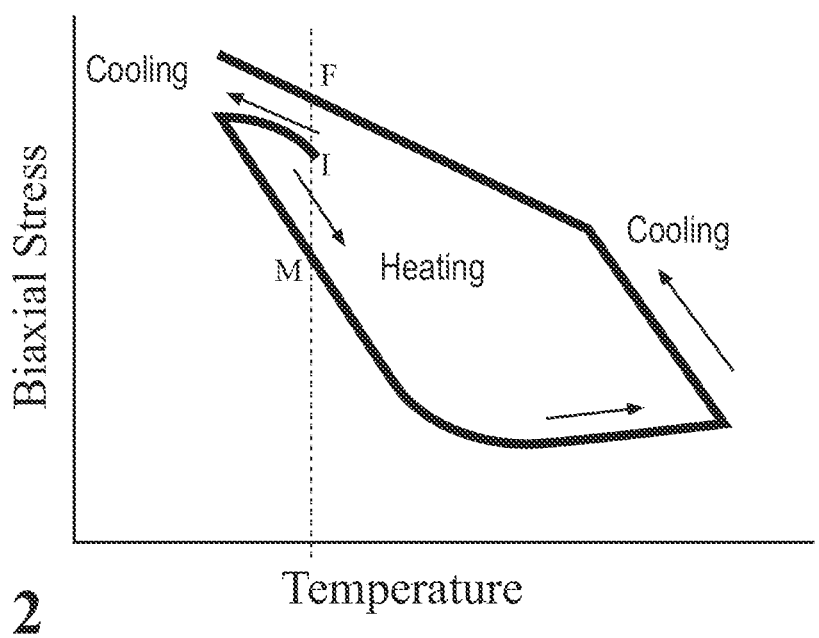
FIG. 2 is a chart of residual stress on an electrical field shield during thermal cycling.
Figure 3:
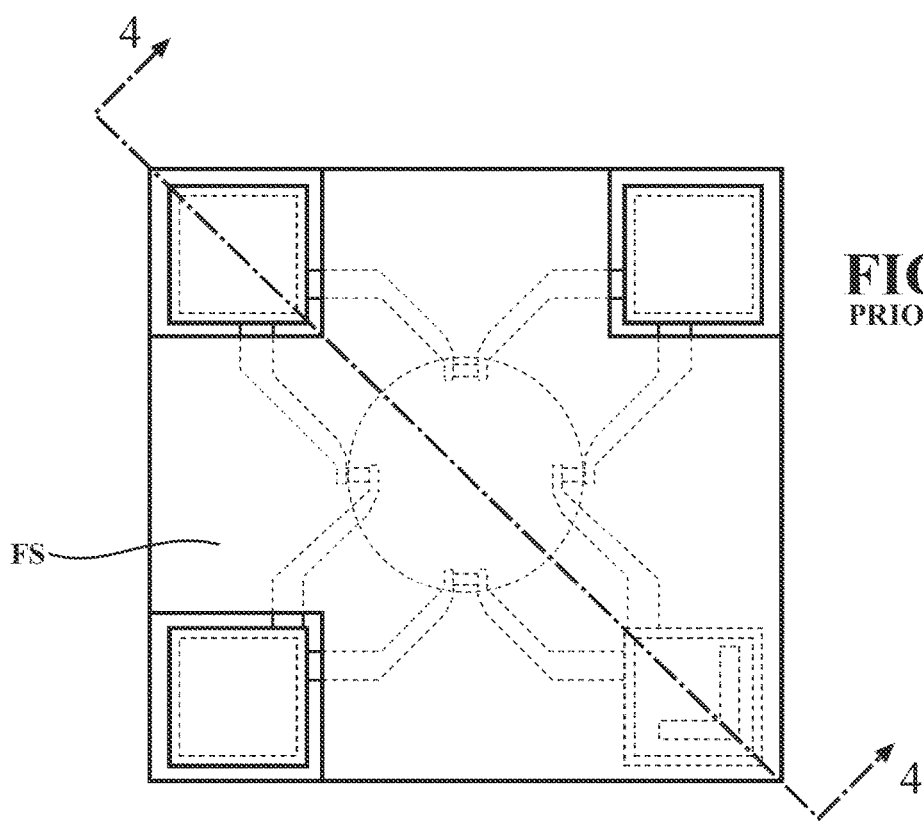
FIG. 3 is a top view of a MEMS pressure sensing element having an electrical field shield without stress adjustors.
Figure 4:
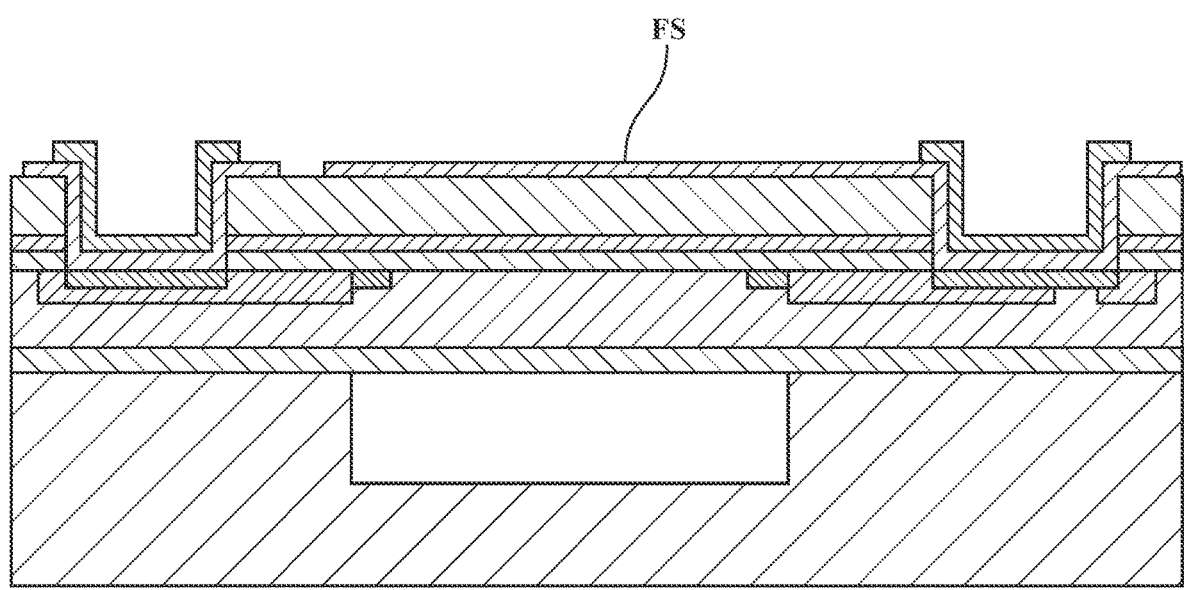
FIG. 4 is a sectional view of a MEMS pressure sensing element having an electrical field shield, taken along lines 4-4 of FIG. 3.
Figure 5:
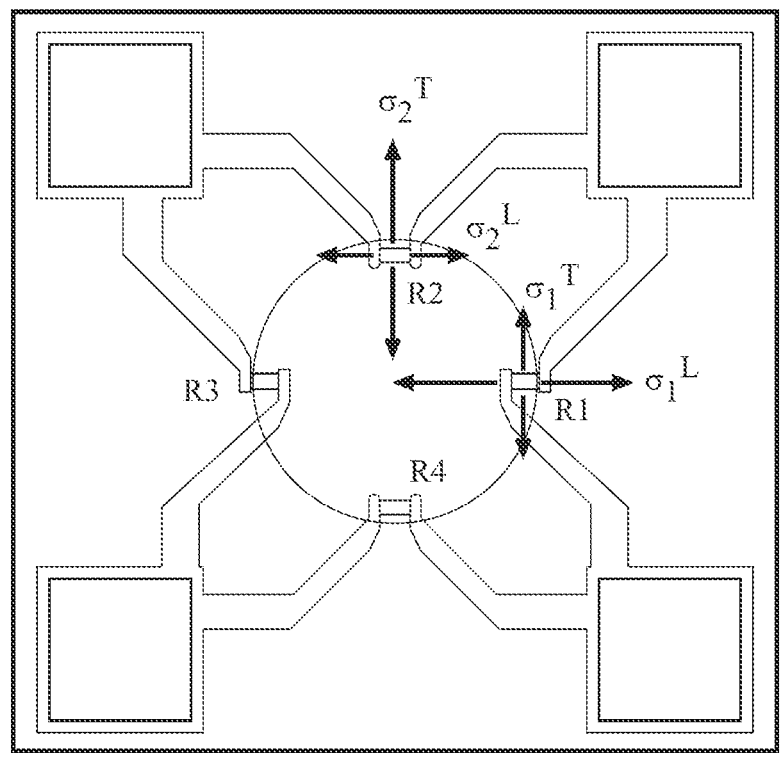
FIG. 5 is a top view of a MEMS pressure sensing element without stress adjustors, showing radial and tangential stresses at a mid-point M of the thermal hysteresis loop in FIG. 1.
Figure 6:
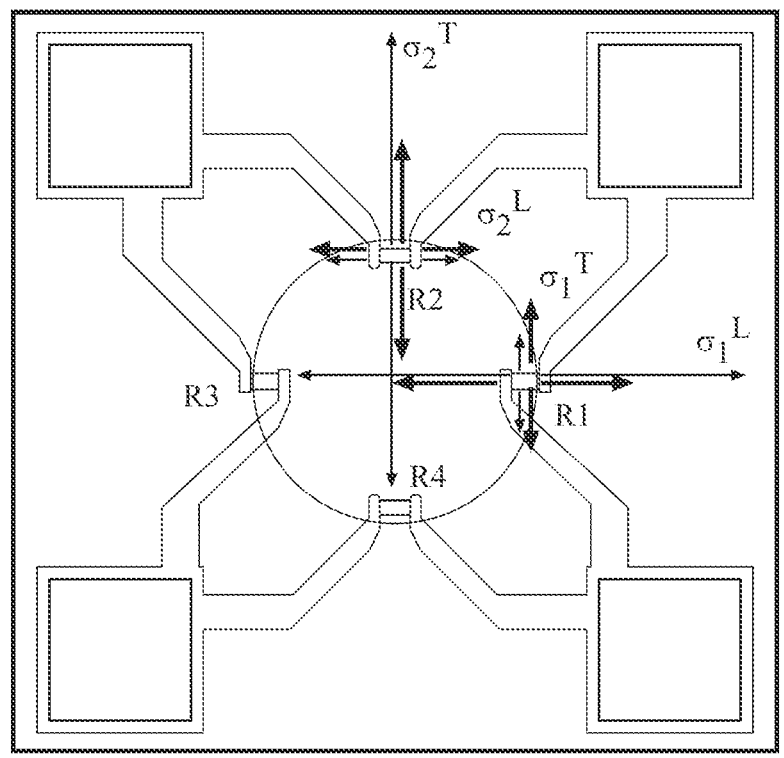
FIG. 6 is s a top view of a MEMS pressure sensing element without stress adjustors, showing radial and tangential stresses induced by pressure and temperature.

As with the previous embodiment, the stress component changes on the piezoresistors 22a, 22b, 22c, 22d cause lower output voltages at the middle point M and the final point F during a cooling and heating cycle shown in FIG. 1, which move the thermal hysteresis voltage more negatively and thus shift the thermal hysteresis downward.

Figure 11:
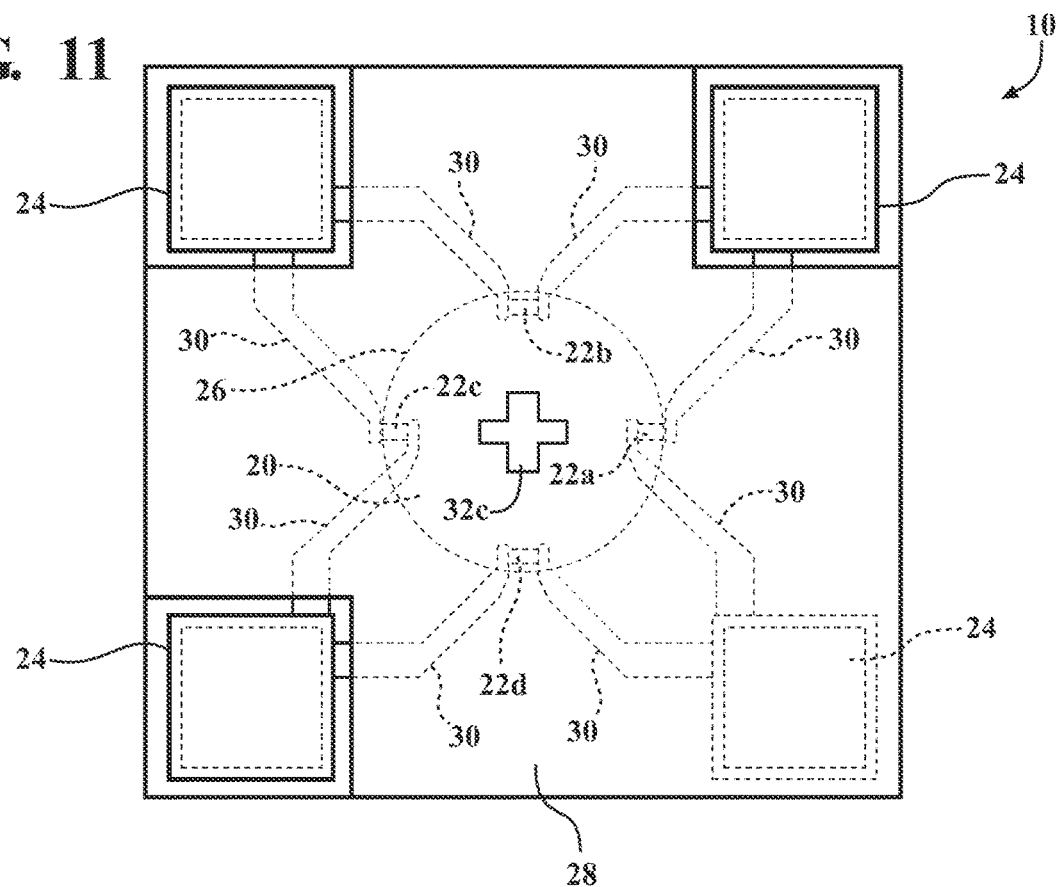
FIG. 11 is a top view of third embodiment of a MEMS pressure sensing element having an electrical field shield with stress adjustors, according to embodiments of the present invention.
Figure 12:
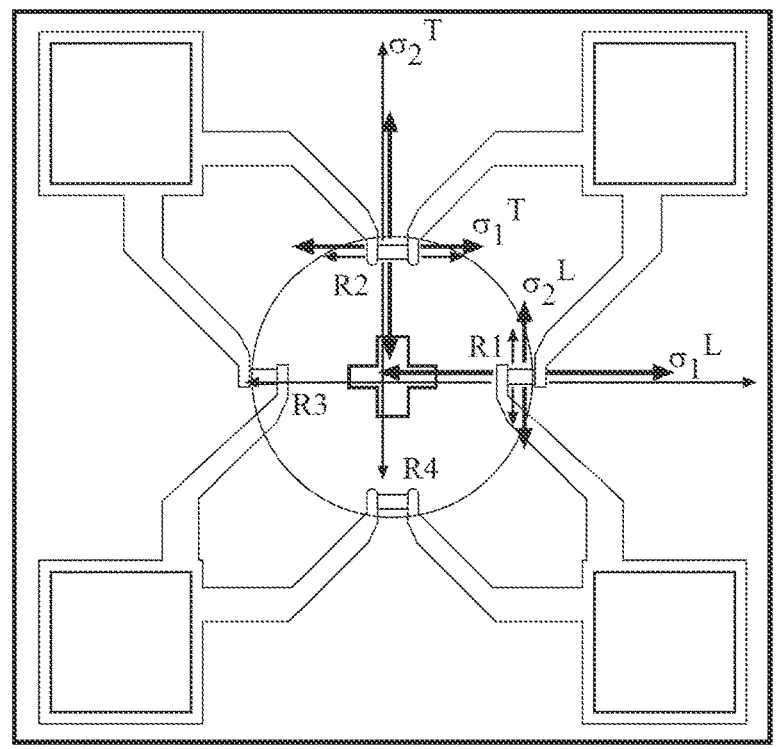
FIG. 12 is a top view of third embodiment of a MEMS pressure sensing element having an electrical field shield with stress adjustors, and showing radial and tangential stresses, according to embodiments of the present invention.

FIGS. 11-12 shows a top view of another embodiment of the MEMS pressure sensing element 10 with an electrical field shield 28 on the outer surface, and the electrical field shield 28 having a stress adjustor 32c. In FIG. 11, the field shield 28 is shown along with the stress adjustor 32c. In FIG. 12, for clarity the field shield 28 is not shown, however, the location of the stress adjustor 32c is still shown. In this embodiment, the stress adjustor 32c is a material removal area in the form of a cross-shaped or X-shaped cut-out located in the center of diaphragm 20, which shifts thermal hysteresis upward. As illustrated in FIG. 12, with a similar effect to the first embodiment having four rectangular near-piezoresistor stress adjustors 32b1, 32b2, 32b3, 32b4 (shown in FIGS. 7A-7C), the embodiment shown in FIGS. 11-12 having a stress adjustor 32c in the center of diaphragm 20 also significantly increases each corresponding radial stress on each piezoresistor 22a, 22b, 22c, 22d and slightly reduces each corresponding tangential stress on each piezoresistor 22a, 22b, 22c, 22d.

The stress component changes on the piezoresistors 22a, 22b, 22c, 22d cause the output voltages higher at the middle point M and the final point F during a cooling and heating cycle shown in FIG. 1, which moves the thermal hysteresis voltage more positively and thus shifts the thermal hysteresis upward. The size and shape of the stress adjustor 32c may be used to adjust the radial stress and tangential stresses and change the magnitude of the thermal hysteresis shift.

Referring to FIG. 13, a summary of the effects of the location of the stress adjustors 32a1, 32a2, 32a3, 32a4 and 32b1, 32b2, 32b3, 32b4, as well as 32c on the electrical field shield 28 is shown. FIG. 13 depicts how the location of the stress adjustors 32a1, 32a2, 32a3, 32a4, 32b1, 32b2, 32b3, 32b4, 32c achieves a shift of thermal hysteresis up or down to minimize thermal hysteresis.

The embodiments of the MEMS pressure sensing element 10 shown in FIGS. 14A-14C, are embodiments where the location of the stress adjustors 32a1, 32a2, 32a3, 32a4, 32d, 32e, 32f achieves a shift of thermal hysteresis negatively to minimize thermal hysteresis.

Further embodiments of the MEMS pressure sensing element 10 are shown in FIGS. 15A-15C, where the location of the stress adjustors 32b1, 32b2, 32b3, 32b4, 32g, 32h achieves a shift of thermal hysteresis positively to minimize thermal hysteresis.

Further embodiments of the MEMS pressure sensing element 10 are shown in FIGS. 16A-16C, where the location of the stress adjustors achieves 32c, 32i, 32j a shift of thermal hysteresis positively to minimize thermal hysteresis.

Figure 17A:
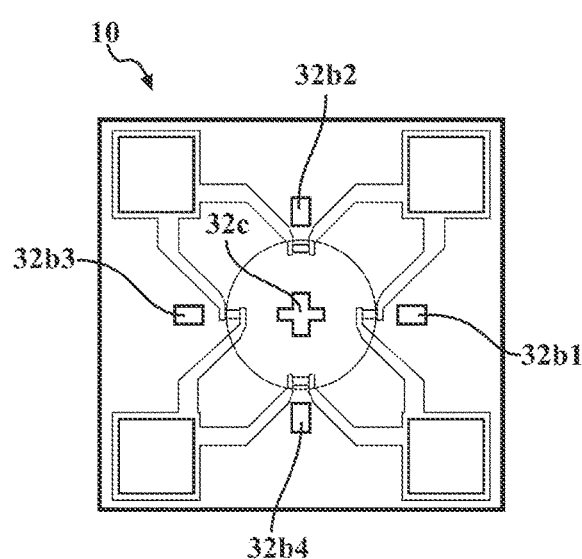
FIG. 17A is a top view of a tenth embodiment of a MEMS pressure sensing element having an electrical field shield with stress adjustors, according to embodiments of the present invention.
Figure 17B:
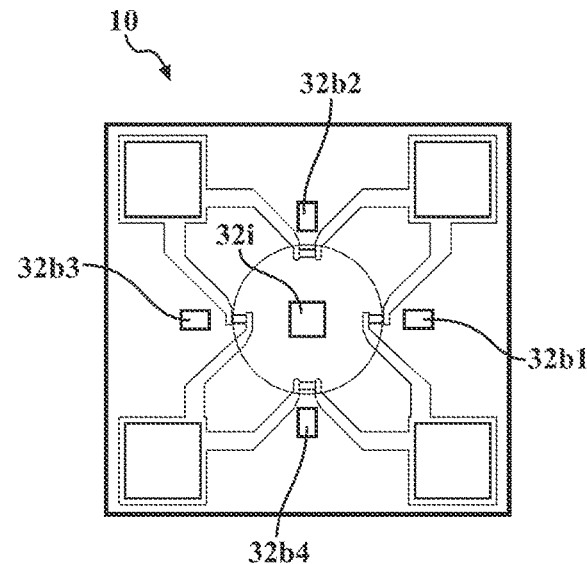
FIG. 17B is a top view of an eleventh embodiment of a MEMS pressure sensing element having an electrical field shield with stress adjustors, according to embodiments of the present invention.

Further embodiments of the MEMS pressure sensing element 10 are shown in FIGS. 17A-17B, where the location of the stress adjustors 32b1, 32b2, 32b3, 32b4, 32c, 32i achieves a higher shift of thermal hysteresis positively to minimize thermal hysteresis. The MEMS pressure sensing element 10 shown in FIG. 17A includes a combination of the stress adjustors 32b1, 32b2, 32b3, 32b4, 32c shown in FIG. 15A and FIG. 16A. The MEMS pressure sensing element 10 shown in FIG. 17B includes a combination of the stress adjustors 32b1, 32b2, 32b3, 32b4, 32i shown in FIG. 15A and FIG. 16B.

Figure 17C:
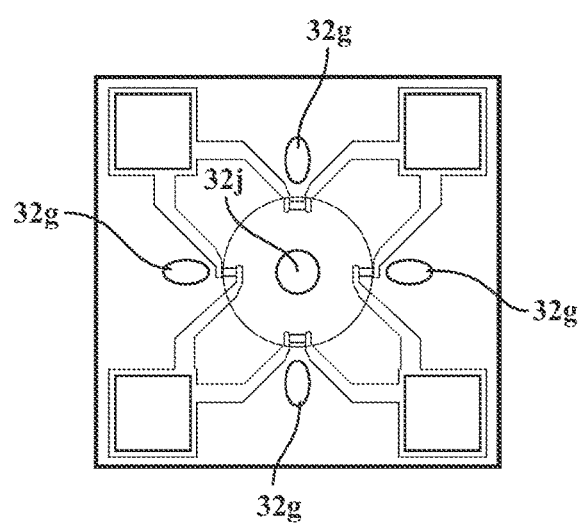
FIG. 17C is a top view of a twelfth embodiment of a MEMS pressure sensing element having an electrical field shield with stress adjustors, according to embodiments of the present invention.
Figure 17D:
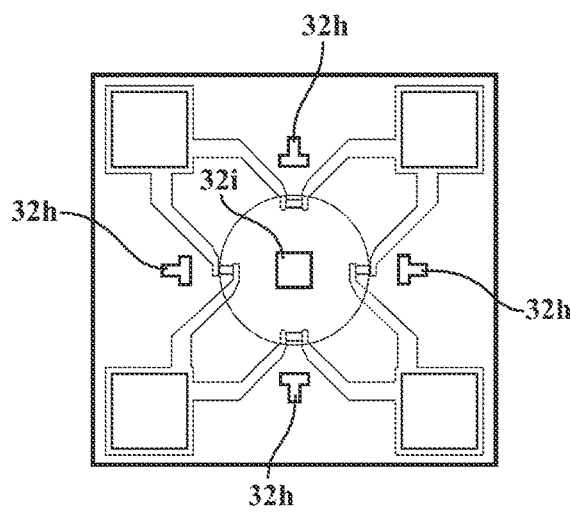
FIG. 17D is a top view of a thirteenth embodiment of a MEMS pressure sensing element having an electrical field shield with stress adjustors, according to embodiments of the present invention.

Further embodiments of the MEMS pressure sensing element 10 are shown in FIGS. 17C-17D, where the location of the stress adjustors 32g, 32h, 32i, 32j achieves a higher shift of thermal hysteresis positively to minimize thermal hysteresis. The MEMS pressure sensing element 10 shown in FIG. 17C includes a combination of the stress adjustors 32g, 32j shown in FIG. 15B and FIG. 16C. The MEMS pressure sensing element 10 shown in FIG. 17D includes a combination of the stress adjustors 32h, 32i shown in FIG. 15C and FIG. 16B.

In the embodiment shown in FIGS. 14A-17D, for clarity the field shield 28 is not shown, however, the location of the stress adjustors in each of these embodiments is still shown, as indicated by the reference numerals.

Other embodiments of the MEMS pressure sensing element 10 are shown in FIGS. 18A-22, where the MEMS pressure sensing element 10 is a differential pressure sensor. The differential pressure sensor is shown with the field shield 28 in FIGS. 18A-18B and 20B-20C, and for clarity the field shield 28 is not shown in FIGS. 19, 20A, and 21-22, with the various examples of the stress adjustors shown in FIGS. 19-22.

In FIGS. 18A-19, the MEMS pressure sensing element 10 is backside etched, and has four quadrants, shown generally at 41, and the top side is also etched to form a thin diaphragm 40, where the diaphragm 40 also includes a cross stiffener 44. This embodiment includes a device layer 52, and a substrate 48, where the device layer 52 includes a silicon layer 52a grown on the top surface of the substrate 48, and at least one electrical insulating layer 52b, as shown in FIG. 18B. The silicon layer 52a and the substrate 48 are integrally formed together. The electrical field shield 28 is applied on an outer surface 46 of the device layer 52 of the pressure sensing element 10 except in the area of the four quadrants 41. A cavity, shown generally at 42 in FIG. 18B, is etched from the bottom side of the substrate 48. Also included are several piezoresistors 50 doped near the edge of the diaphragm 40 on the top side of the silicon layer 52a, and several conductors 30 are also doped on the top side of the silicon layer 52a. The conductors 30 are connected to corresponding bonds pads 34 on the top side of the device layer 52.

As previously mentioned, the electrical field shield 28 is applied on the outer surface 46 of the device layer 52 of the pressure sensing element 10 except in the area of the four quadrants 41. However, it is within the scope of the invention that in other embodiments the electrical field shield 28 may be applied to the device layer 52 such that the electrical field shield 28 may be located in the quadrants 41 as well.

In FIG. 19, the MEMS pressure sensing element 10 includes a plurality of stress adjustors 32e, 32f, which in this embodiment are cut outs, which achieves a shift of thermal hysteresis negatively to minimize thermal hysteresis. In FIG. 19, for clarity the field shield 28 is not shown, however, the location of the stress adjustors 32e, 32f is still shown. The stress adjustors 32e, 32f shown in FIG. 19 are similar to the stress adjustors 32e, 32f shown in FIG. 14C, but are arranged in a different L-shaped configuration.

Figure 20A:
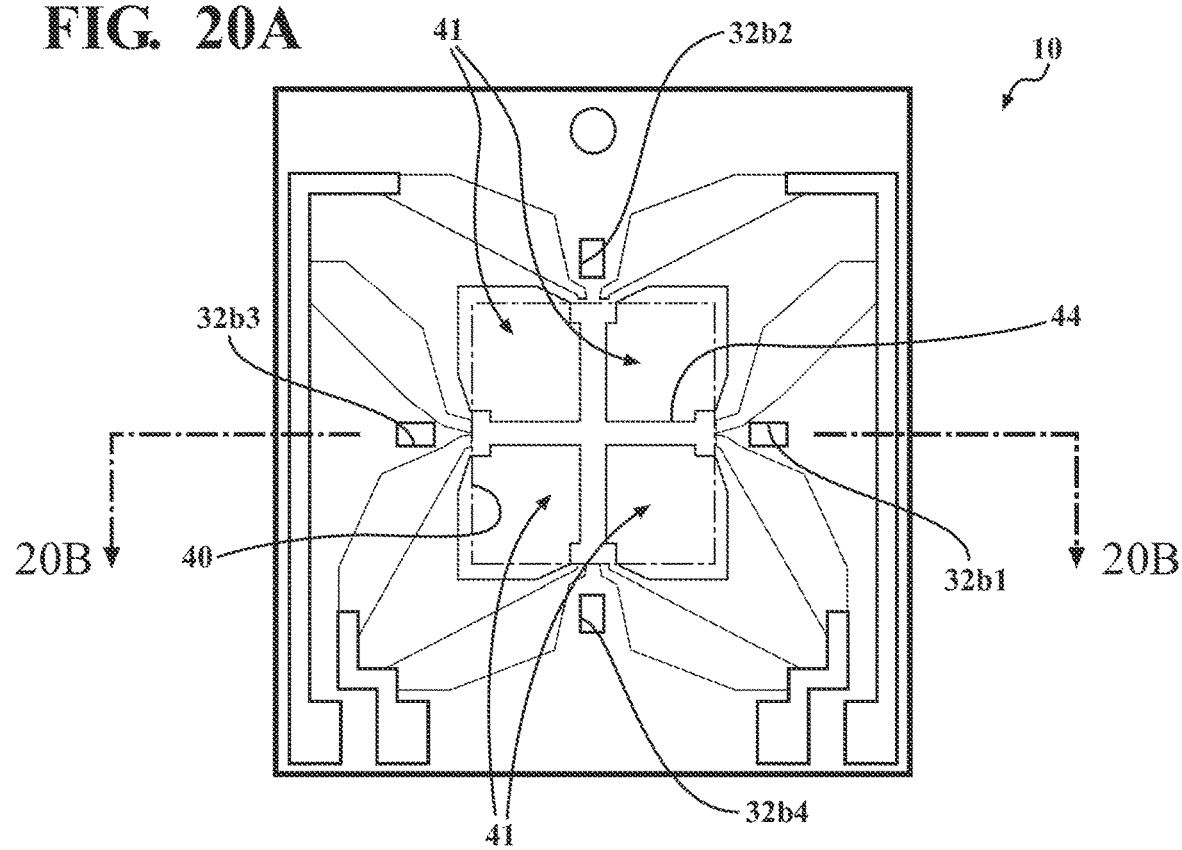
FIG. 20A is a top view of a second embodiment of a differential MEMS pressure sensing element having an electrical field shield with stress adjustors, according to embodiments of the present invention.
Figure 20B:
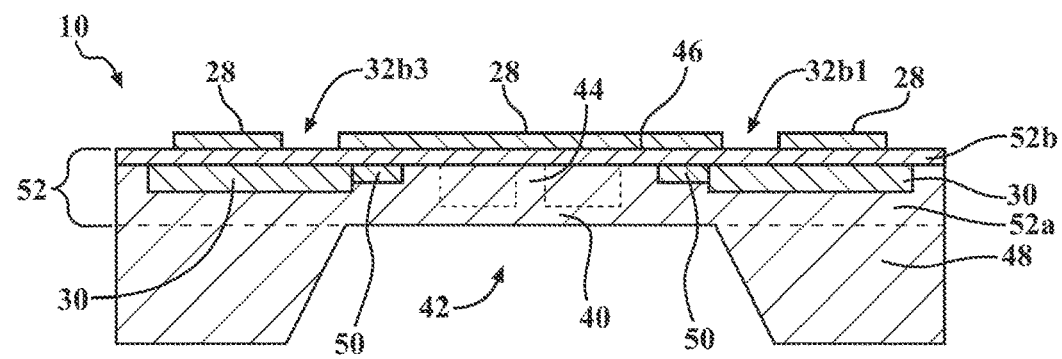
FIG. 20B is a sectional view taken along lines 20B-20B in FIG. 20A.

In FIGS. 20A-20B, the MEMS pressure sensing element 10 includes several stress adjustors 32b1, 32b2, 32b3, 32b4, which in this embodiment are cut outs, which achieves a shift of thermal hysteresis positively to minimize thermal hysteresis.

Figure 20C:
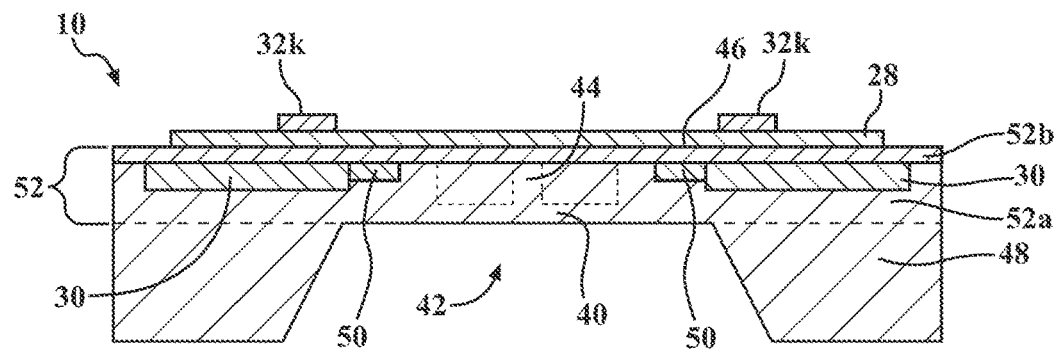
FIG. 20C is a sectional view of an alternate embodiment of the pressure sensing element shown in FIGS. 20A-20C having an electrical field shield with stress adjustors according to embodiments of the present invention.

Referring now to FIG. 20C, an alternate embodiment of the pressure sensing element 10 is shown. This embodiment is similar to the embodiment shown in FIGS. 20A-20B, however, there are no cut outs, and the field shield 28 therefore has no material removal areas. The field shield 28 shown in FIG. 20C has the stress adjustors 32k, which in this embodiment are in the form of a thin film deposited on areas of the field shield 28, to minimize thermal hysteresis. In the embodiment shown in 20C, the stress adjustors 32k are located in the areas on the field shield 28 as shown, but it is within the scope of the invention that the stress adjustors 32k may be located on other areas of the field shield 28.

Figure 21:
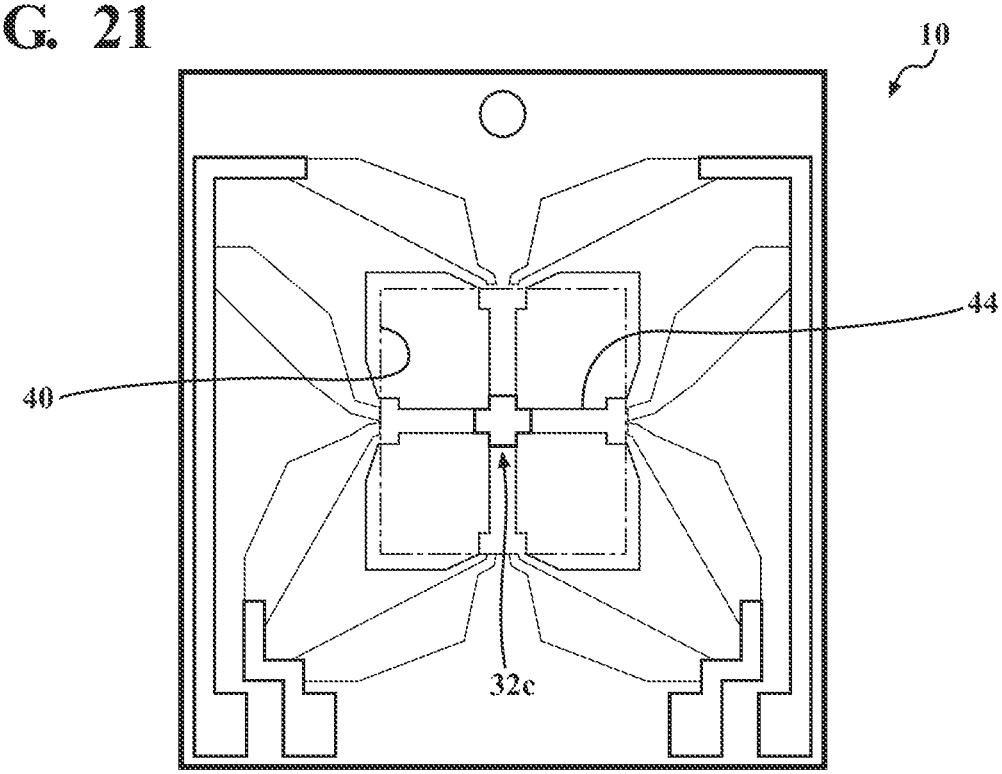
FIG. 21 is a top view of a third embodiment of a differential MEMS pressure sensing element having an electrical field shield with stress adjustors, according to embodiments of the present invention.

In FIG. 21, the MEMS pressure sensing element 10 includes the stress adjustor 32c, which in this embodiment is a cut out, which achieves a shift of thermal hysteresis positively to minimize thermal hysteresis.

Figure 22:
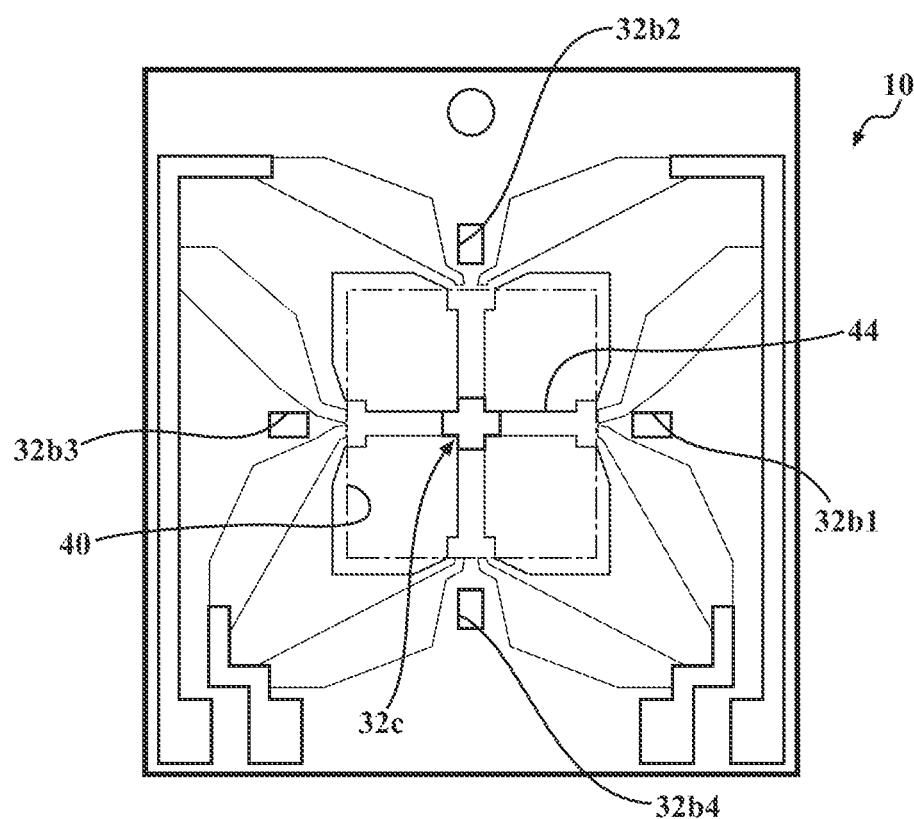
FIG. 22 is a top view of a fourth embodiment of a differential MEMS pressure sensing element having an electrical field shield with stress adjustors, according to embodiments of the present invention.

Referring now to the MEMS pressure sensing element 10 shown in FIG. 22, the stress adjustors are a combination of the stress adjustors 32b1, 32b2, 32b3, 32b4, 32i shown in FIG. 20 and the stress adjustor 32c shown in FIG. 21. The MEMS pressure sensing element 10 achieves a shift of thermal hysteresis positively to minimize thermal hysteresis.

In alternate embodiments, the stress adjustors used in FIGS. 18A-18B, 19-20B, and 21-22 may also be a thin film (similar to the stress adjustors 32k) deposited on the outer surface such that the thin film is on top of the electrical field shield 28 with the residual stresses that the thin film applied on the plurality of piezoresistors to adjust the longitudinal and transverse stresses on the piezoresistors during thermal cycling to minimize the thermal hysteresis.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A pressure sensing element, comprising:
   a supporting substrate
   a cavity integrally formed as part of the supporting substrate;
   a device layer bonded to the supporting substrate;
   a diaphragm being part of the device layer, the diaphragm covering the cavity in a sealed manner;
   a plurality of piezoresistors coupled to the diaphragm;
   a plurality of bond pads disposed on the device layer;
   an electrical field shield bonded to an outer surface of the device layer such that the electrical field shield is on top of the device layer and at least one of the bond pads; and
   at least one stress adjustor being part of the electrical field shield;
   wherein the at least one stress adjustor is constructed and arranged to reduce thermal hysteresis of the pressure sensing element caused by stress relaxation of the electrical field shield during a cooling and heating cycle of the pressure sensing element.

2. The pressure sensing element of claim 1, the at least one stress adjustor further comprising a plurality of stress adjustors.

3. The pressure sensing element of claim 1, wherein the at least one stress adjustor is integrally formed as part of the electrical field shield so as to decrease radial stresses on the plurality of piezoresistors and increase tangential stresses on the plurality of piezoresistors during the cooling and heating cycle.

4. The pressure sensing element of claim 1, wherein the at least one stress adjustor is integrally formed as part of the electrical field shield so as to increase radial stresses on the plurality of piezoresistors and decrease tangential stresses on the plurality of piezoresistors during the cooling and heating cycle.

5. The pressure sensing element of claim 1, the at least one stress adjustor further comprising a cut-out.

6. The pressure sensing element of claim 5, the cut-out further comprising a portion of the electrical field shield which has been removed.

7. The pressure sensing element of claim 5, wherein the cut-out is L-shaped.

8. The pressure sensing element of claim 5, wherein the cut-out is square-shaped.

9. The pressure sensing element of claim 5, wherein the cut-out is circular-shaped.

10. The pressure sensing element of claim 5, wherein the cut-out is rectangular-shaped.

11. The pressure sensing element of claim 5, wherein the cut-out is cross-shaped.

12. The pressure sensing element of claim 5, wherein the cut-out is T-shaped.

13. The pressure sensing element of claim 5, the cut-out further comprising a plurality of cut-outs, each of the plurality of cut-outs are rectangular shaped, and at least two of the plurality of cut-outs are arranged in an L-shaped configuration.

14. The pressure sensing element of claim 1, at least one stress adjustor further comprising a thin film, where the thin film deposited on the electrical field shield.

15. The pressure sensing element of claim 14, wherein the thin film applies residual stress to the plurality of piezoresistors.

16. A pressure sensing element, comprising:
a substrate having a cavity;
a device layer coupled to the substrate;
a diaphragm being part of the device layer;
a plurality of piezoresistors coupled to the diaphragm;
a plurality of bond pads disposed on the device layer;
an electrical field shield bonded to an outer surface of the device layer and at least one of the bond pads; and
at least one stress adjustor being part of the electrical field shield;
wherein the at least one stress adjustor is constructed and arranged to reduce thermal hysteresis of the pressure sensing element caused by stress relaxation of the electrical field shield during a cooling and heating cycle of the pressure sensing element.

17. The pressure sensing element of claim 16, the at least one stress adjustor further comprising a plurality of stress adjustors.

18. The pressure sensing element of claim 16, wherein the at least one stress adjustor is integrally formed as part of the electrical field shield so as to decrease radial stresses on the plurality of piezoresistors and increase tangential stresses on the plurality of piezoresistors during the cooling and heating cycle.

19. The pressure sensing element of claim 16, wherein the at least one stress adjustor is integrally formed as part of the electrical field shield so as to increase radial stresses on the plurality of piezoresistors and decrease tangential stresses on the plurality of piezoresistors during the cooling and heating cycle.

20. The pressure sensing element of claim 16, the at least one stress adjustor further comprising a cut-out.

21. The pressure sensing element of claim 20, the cut-out further comprising a portion of the electrical field shield which has been removed.

22. The pressure sensing element of claim 20, wherein the cut-out is L-shaped.

23. The pressure sensing element of claim 20, wherein the cut-out is square-shaped.

24. The pressure sensing element of claim 20, wherein the cut-out is circular-shaped.

25. The pressure sensing element of claim 20, wherein the cut-out is rectangular-shaped.

26. The pressure sensing element of claim 20, wherein the cut-out is cross-shaped.

27. The pressure sensing element of claim 20, wherein the cut-out is T-shaped.

28. The pressure sensing element of claim 20, the cut-out further comprising a plurality of cut-outs, each of the plurality of cut-outs are rectangular shaped, and at least two of the plurality of cut-outs are arranged in an L-shaped configuration.

29. The pressure sensing element of claim 16, at least one stress adjustor further comprising a thin film, where the thin film deposited on the electrical field shield.

30. The pressure sensing element of claim 29, wherein the thin film applies residual stress to the plurality of piezoresistors.

* * * * *